United States Patent
Lee

(10) Patent No.: US 11,314,347 B2
(45) Date of Patent: Apr. 26, 2022

(54) METHOD FOR MANUFACTURING DIGITIZER ASSEMBLE, METHOD FOR MANUFACTURING DISPLAY DEVICE USING THE SAME, AND DISPLAY DEVICE

(71) Applicant: Samsung Display Co., Ltd., Yongin-Si (KR)

(72) Inventor: Dong-Gyu Lee, Seongnam-si (KR)

(73) Assignee: Samsung Display Co., Ltd.

(*) Notice: Subject to any disclaimer, the term of this patent is extended or adjusted under 35 U.S.C. 154(b) by 0 days.

(21) Appl. No.: 16/046,828

(22) Filed: Jul. 26, 2018

(65) Prior Publication Data
US 2019/0212851 A1    Jul. 11, 2019

(30) Foreign Application Priority Data
Jan. 10, 2018 (KR) .......................... 10-2018-0003574

(51) Int. Cl.
| G06F 3/041 | (2006.01) |
| H05K 9/00 | (2006.01) |
| H05K 7/20 | (2006.01) |
| G06F 3/046 | (2006.01) |

(52) U.S. Cl.
CPC ............ *G06F 3/0412* (2013.01); *G06F 3/046* (2013.01); *H05K 7/20963* (2013.01); *H05K 9/0054* (2013.01); *G06F 2203/04103* (2013.01); *G06F 2203/04107* (2013.01)

(58) Field of Classification Search
CPC ............... G06F 3/0412; G06F 3/046; G06F 2203/04103; G06F 2203/04107; H05K 7/20963; H05K 9/0054
See application file for complete search history.

(56) References Cited

U.S. PATENT DOCUMENTS

| 9,736,950 B2 | 8/2017 | Kwon et al. | |
| 2006/0146034 A1* | 7/2006 | Chen | G02F 1/13338 345/173 |
| 2008/0277375 A1* | 11/2008 | Paek | G02F 1/16755 216/17 |
| 2009/0275158 A1* | 11/2009 | Okamoto | G02F 1/133351 438/30 |

(Continued)

FOREIGN PATENT DOCUMENTS

| JP | 2009-294771 A | 12/2009 |
| KR | 10-2014-0108021 A | 9/2014 |

(Continued)

*Primary Examiner* — Katherine A Bareford
*Assistant Examiner* — Christina D McClure
(74) *Attorney, Agent, or Firm* — Innovation Counsel LLP

(57) ABSTRACT

A method for manufacturing a display device according to an exemplary embodiment of the present inventive concept includes: forming a digitizer assembly; and attaching the digitizer assembly to a bottom of a display panel, wherein the forming the digitizer assembly comprises forming through-hole portions in a heat dissipation sheet layer, forming a digitizer board by sequentially attaching a buffering sheet layer, a digitizer layer, a shield sheet layer, and the heat dissipation sheet layer, and forming a plurality of digitizer assemblies by cutting the digitizer board, wherein the through-hole portions partially expose the shield sheet layer and are disposed at corners of the digitizer assembly.

9 Claims, 6 Drawing Sheets

(56) References Cited

U.S. PATENT DOCUMENTS

| | | | |
|---|---|---|---|
| 2015/0123860 A1* | 5/2015 | Park | H01Q 1/526 |
| | | | 343/720 |
| 2016/0284781 A1* | 9/2016 | Jiang | H01L 27/3276 |
| 2017/0136727 A1* | 5/2017 | Miyamoto | B32B 27/08 |

FOREIGN PATENT DOCUMENTS

| | | |
|---|---|---|
| KR | 10-2015-0051054 A | 5/2015 |
| KR | 10-2016-0027679 A | 3/2016 |
| KR | 10-2016-0097105 A | 8/2016 |
| KR | 10-2017-0015597 A | 2/2017 |

* cited by examiner

METHOD FOR MANUFACTURING DIGITIZER ASSEMBLE, METHOD FOR MANUFACTURING DISPLAY DEVICE USING THE SAME, AND DISPLAY DEVICE

CROSS-REFERENCE TO RELATED APPLICATION

This application claims priority to and the benefit of Korean Patent Application No. 10-2018-0003574 filed in the Korean Intellectual Property Office on Jan. 10, 2018, the entire contents of which are incorporated herein by reference.

BACKGROUND

(a) Technical Field

The present inventive concept relates to a method for manufacturing a digitizer assembly, a method for manufacturing a display device using the same, and a display device.

(b) Description of the Related Art

A display device may include a digitizer for inputting an electrical graphics signal by touching a displayed screen. In addition, the display device may include a plurality of sheets having functions such as buffering, heat dissipation, shielding of electromagnetic noise, and the like.

Recently, display devices have been continuously studied with respect to reducing a dead space and a bezel area. Accordingly, the plurality of sheets having various functions need to be manufactured to have a reduced dead space and a bezel area.

The above information disclosed in this Background section is only for enhancement of understanding of the background of the inventive concept and therefore it may contain information that does not form the prior art that is already known in this country to a person of ordinary skill in the art.

SUMMARY

Exemplary embodiments are provided to prevent a process failure in a manufacturing process of a display device where a digitizer is applied.

A method for manufacturing a display device according to an exemplary embodiment of the present inventive concept includes: forming a digitizer assembly; and attaching the digitizer assembly to a bottom of a display panel, wherein the forming the digitizer assembly includes forming through-hole portions in a heat dissipation sheet layer, forming a digitizer board by sequentially attaching a buffering sheet layer, a digitizer layer, a shield sheet layer, and the heat dissipation sheet layer, and forming a plurality of digitizer assemblies by cutting the digitizer board, wherein the through-hole portions partially expose the shield sheet layer and are disposed at corners of the digitizer assembly.

In the forming of the plurality of digitizer assemblies, a blanking process using a press may be performed.

The digitizer assembly may include a buffering sheet, a digitizer, a shield sheet, and a heat dissipation sheet that are sequentially attached.

The heat dissipation sheet may include openings that partially expose the shield sheet.

The openings may be disposed at corners of the heat dissipation sheet.

The openings may be disposed corresponding to the through-hole portions.

According to an exemplary embodiment of the present inventive concept, a method for manufacturing a digitizer assembly that includes a buffering sheet, a digitizer, a shield sheet, and a heat dissipation sheet is provided. The method for manufacturing the digitizer assembly includes: forming through-hole portions in a heat dissipation sheet layer; forming a digitizer board by sequentially attaching a buffering sheet layer, a digitizer layer, a shield sheet layer, and the heat dissipation sheet layer; and cutting the digitizer board into a plurality of digitizer assemblies, wherein the through-hole portions partially expose the shield sheet layer and are disposed at corners of the heat dissipation sheet.

The cutting of the digitizer board may include performing a blanking process using a press.

A display device according to an exemplary embodiment of the present inventive concept dudes: a display panel; and a digitizer assembly disposed below the display panel, wherein the digitizer assembly includes a buffering sheet disposed below the display panel, a digitizer disposed below the buffering sheet, a shield sheet disposed below the digitizer, and a heat dissipation sheet disposed below the shield sheet, wherein the heat dissipation sheet includes openings that partially expose the shield sheet.

According to the exemplary embodiments, the through-holes are formed in the heat dissipation sheet first in manufacturing of the digitizer assembly, and then the digitizer assembly is manufactured to thereby reduce a failure in a blanking process.

DETAILED DESCRIPTION OF THE EMBODIMENTS

Figure 1:
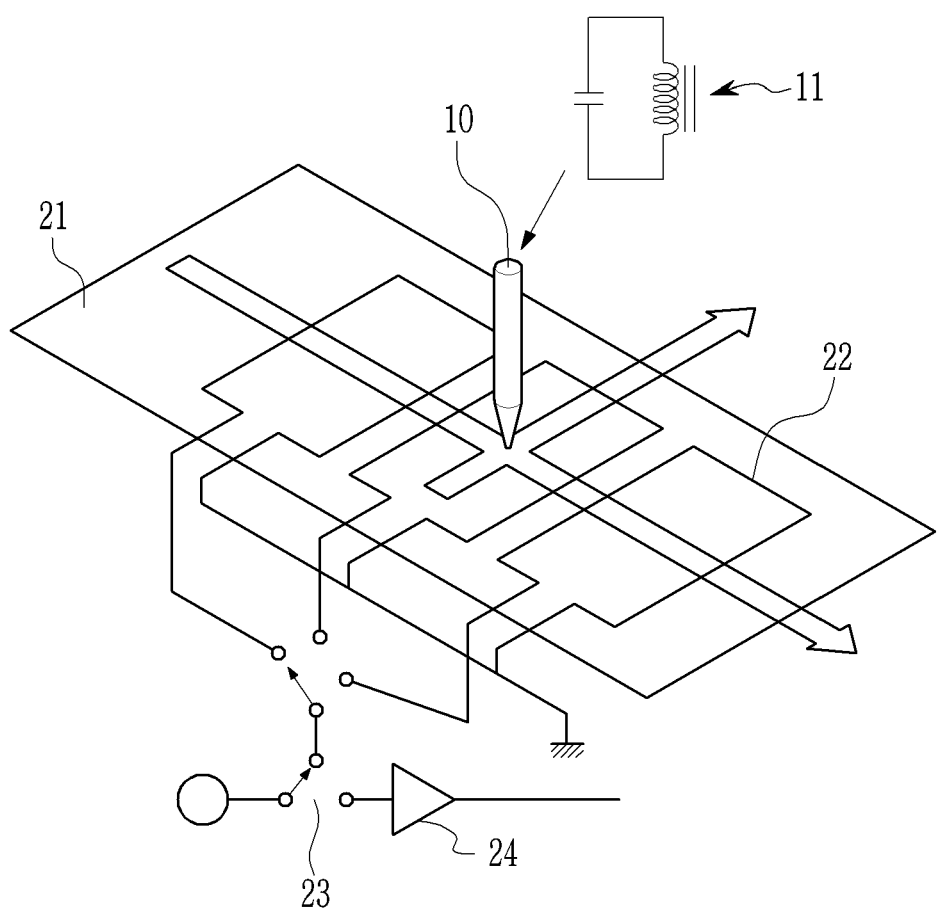
FIG. 1 shows a schematic operating principle of a typical electromagnetic type of digitizer.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

The drawings and description are to be regarded as illustrative in nature and not restrictive. Like reference numerals designate like elements throughout the specification.

Further, in the drawings, size and thickness of each element are arbitrarily represented for better understanding and ease of description, but the present inventive concept is not limited thereto In the drawings, the thickness of layers, films, panels, regions, etc., are exaggerated for clarity. In addition, in the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

FIG. 1 shows a schematic operating principle of a typical electromagnetic type of digitizer.

Referring to FIG. 1, an electromagnetic type of digitizer (hereinafter referred to as an electromagnetic digitizer) includes a plurality of antennal coils 22 disposed on a sensor board 21, and detects a position of a pen 10 by sensing a signal generated from a resonance circuit 11 in the pen 10. In this case, the position of the pen 10 can be recognized by the electromagnetic digitizer by a sensed signal 23 which passes a receiving circuit 24.

Figure 2:
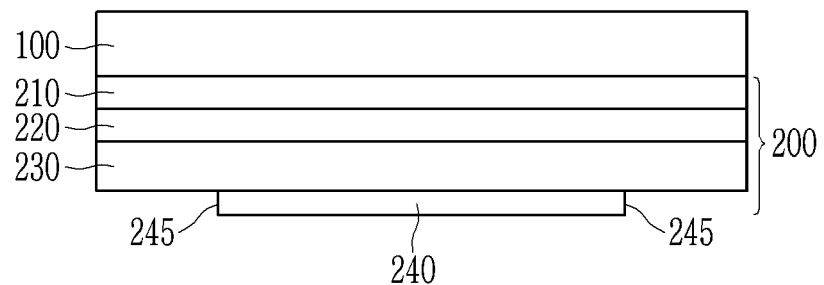
FIG. 2 schematically illustrates a cross-section of a display device according to an exemplary embodiment of the present inventive concept.
Figure 3:
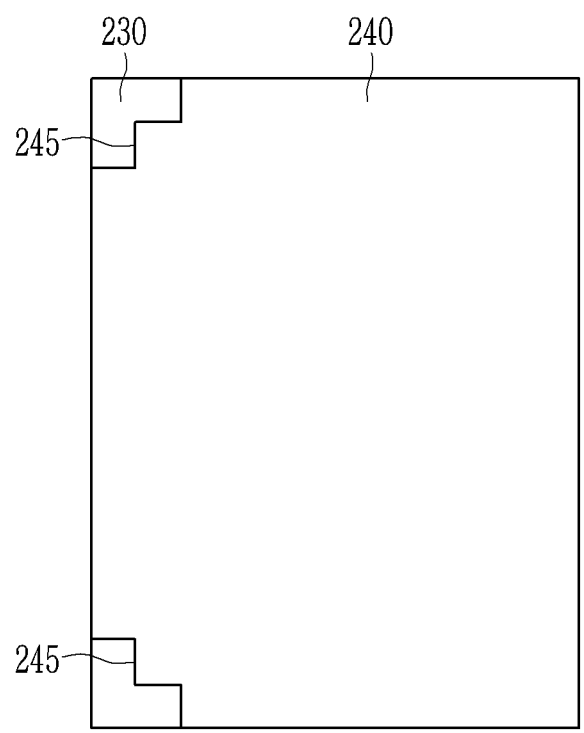
FIG. 3 exemplarily illustrates an example of a bottom side of the display device of FIG. 2.

FIG. 2 schematically illustrates a cross-section of a display device according to an exemplary embodiment of the present inventive concept. FIG. 3 exemplarily illustrates an example of a bottom side of the display device of FIG. 2.

Referring to FIG. 2 and FIG. 3, a display device 1000 according to the present exemplary embodiment includes a display panel 100 and a digitizer assembly 200 that is disposed below the display panel 100.

The display panel 100 displays an image realized by the display device 1000. For example, when the display device 1000 is a mobile terminal such as a mobile phone, an image such as a user interface (UI) or a graphical user interface (GUI), which relates to a call, can be displayed.

The display panel 100 may include a plurality of transistors disposed on a substrate, a light emitting diode, and a plurality of wires that are connected with the light emitting diode.

Alternatively, a plurality of transistors, a substrate where a plurality of pixel electrodes and a plurality of wires that are connected with the plurality of pixel electrodes are disposed, a substrate where a plurality of color filters and a common electrode are disposed, and a liquid crystal layer that is disposed between the two substrates may be included.

A touch sensor or a touch panel that is provided in the form of a touch film, a touch sheet, a touch pad, and the like and senses a touch operation may be disposed above the display panel 100. In addition, a window and an upper case may be disposed on the touch sensor or the touch panel.

The digitizer assembly 200 includes a buffering sheet 210, a digitizer 220, a shield sheet 230, and a heat dissipation sheet 240. The digitizer assembly 200 has a quadrangular shape in a plan view.

The buffering sheet 210 is disposed below the display panel 100. The buffering sheet 210 protects the display panel 100 from an external impact and buffers the external impact.

The digitizer 220 is disposed below the buffering sheet 210. The digitizer 220 converts analog data to digital data. The digitizer 220 may convert coordinates of original data such as an image, a figure, a three dimensional shape, and the like as a digital signal. Such a digitizer 220 may be an electromagnetic type of digitizer.

The shield sheet 230 is disposed below the digitizer 220. The shield sheet 230 prevents receiving of a desired electronic signal from being interrupted due to an unnecessary electromagnetic signal or electromagnetic noise. That is, the shield sheet 230 may shield electromagnetic noise.

The heat dissipation sheet 240 is disposed below the shield sheet 230. The heat dissipation sheet 240 may evenly spread heat generated from the display panel 100 to the entire plane to prevent heat concentration. The heat dissipation sheet 240 includes openings 245 that partially expose the shield sheet 230. The openings 245 may be disposed at corners of the heat dissipation sheet 240. The heat dissipation sheet 240 may include copper. In the present exemplary embodiment, the openings 245 are disposed at two corners among corners of the heat dissipation sheet 240, but this is not restrictive. The openings 245 may be disposed at all the corners of the heat dissipation sheet 240. Alternatively, the openings 245 may be disposed not only at the corners of the heat dissipation sheet 240 but also at other portions.

A lower case of the display device 1000 may be disposed below the digitizer assembly 200.

A method for manufacturing a display device according to an exemplary embodiment of the present inventive concept will be described referring to FIG. 4 to FIG. 9, together with FIG. 2.

FIG. 4 to FIG. 9 schematically illustrate a method for manufacturing a display device according to an exemplary embodiment of the present inventive concept.

Figure 4:
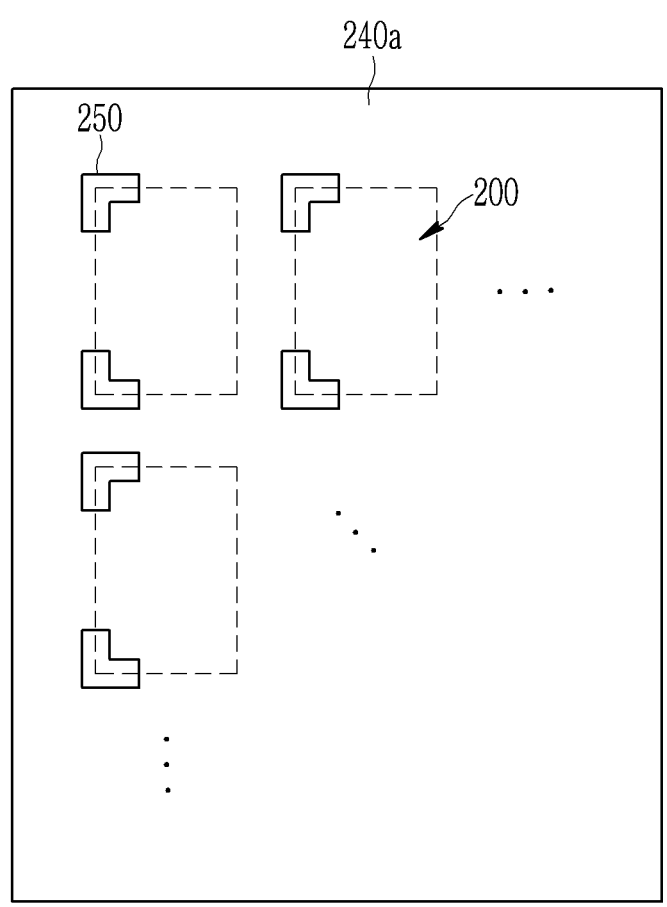
FIG. 4, FIG. 5, FIG. 6, FIG. 7, FIG. 8 and FIG. 9 schematically illustrate a method for manufacturing a display device of the present inventive concept.

Referring to FIG. 4, a heat dissipation sheet layer 240a is prepared, and then through-hole portions 250 are formed in the heat dissipation sheet layer 240a. The through-hole portions 250 may be disposed at corners of a digitizer assembly 200, which will be formed later. In the present exemplary embodiment, the through-hole portions 250 are disposed at two of the corners of the digitizer assembly 200, but this is not restrictive. They may be disposed at all the corners of the digitizer assembly 200. In addition, the through-hole portion may be disposed not only at the corners but also at other portions. In the present exemplary embodiment, the through-hole portion 250 has a shape of "]" and "[" but this is not restrictive. The through-hole portion 250 may have various shapes.

Figure 5:
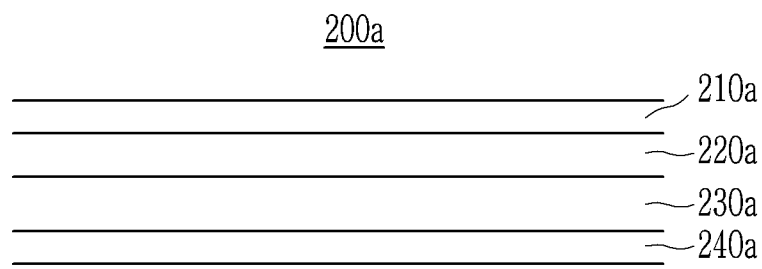
Figure 6:
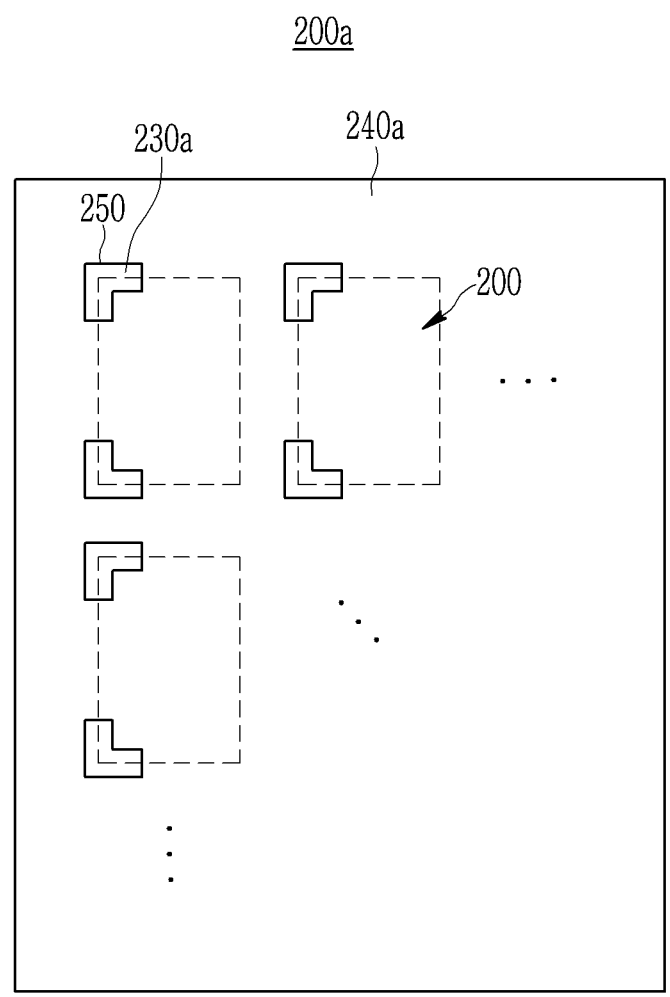

Referring to FIG. 5 and FIG. 6, a buffering sheet layer 210a, a digitizer layer 220a, and a shield sheet layer 230a are prepared, and then the buffering sheet layer 210a, the digitizer layer 220a, the shield sheet layer 230a, and the heat dissipation sheet layer 240a are sequentially attached such that a digitizer board 200a is formed. The through-hole portions 250 expose the shield sheet layer 230a.

Figure 7:
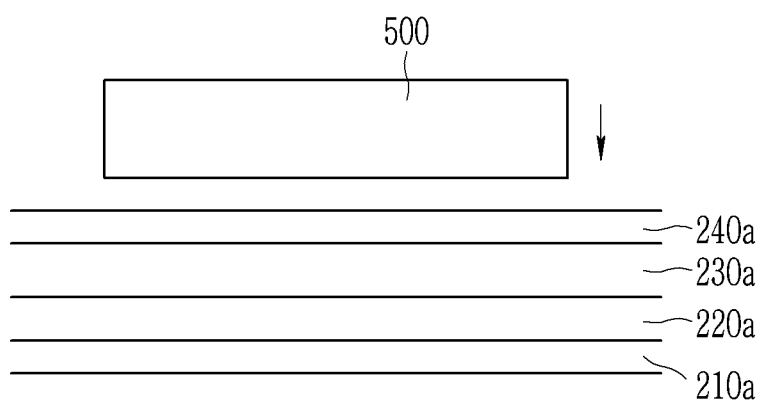

Referring to FIG. 7, the digitizer board 200a is cut to form a plurality of digitizer assemblies 200. The plurality of digitizer assemblies 200 are formed by performing a blanking process with a press 500.

Figure 8:
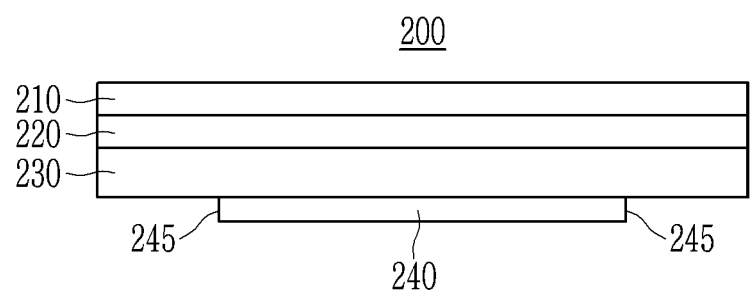
Figure 9:
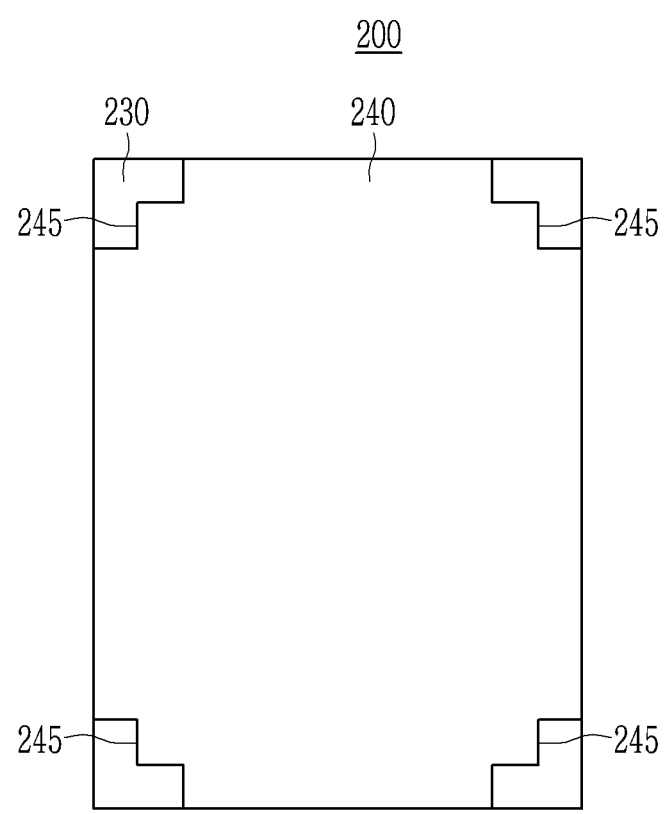

Referring to FIG. 8 and FIG. 9, each digitizer assembly 200 includes a buffering sheet 210, a digitizer 220, a shield sheet 230, and a heat dissipation sheet 240. The heat dissipation sheet 240 includes openings that partially expose the shield sheet 230. The openings 245 may be disposed at corners of the heat dissipation sheet 240. That is, the openings 245 are disposed corresponding to the through-hole portions 250.

FIG. 8 exemplarily shows a cross-section of one of the plurality of digitizer assemblies formed after the blanking process is performed, and FIG. 9 schematically shows an exemplary bottom side of the digitizer assembly of FIG. 8.

As described, in the present exemplary embodiment, the digitizer assemblies 200, each including the buffering sheet 210, the digitizer 220, the shield sheet 230, and the heat dissipation sheet 240, are formed at once through the blanking process with the press 500 after the digitizer board 200a is formed.

In the blanking process, the through-hole portions 250 are cut, and the press 500 does not contact the heat dissipation sheet 240 that is disposed at the corners of the digitizer assembly 200 by the through-hole portions 250.

In a general blanking process, wrinkles are formed at a portion of the heat dissipation sheet 240 contacting the press 500, thereby causing the heat dissipation sheet 240 to be lifted. In particular, the wrinkles may be formed at the corners of the heat dissipation sheet 240 during the blanking process. However, in the present exemplary embodiment, the blanking process is performed after the through-hole portions 250 are formed in the heat dissipation sheet layer 240a such that the heat dissipation sheet 240 does not contact the press 500 at the corners of the heat dissipation sheet 240, thereby preventing formation of the wrinkles. Accordingly, permeation of moisture and other impurities through the wrinkles can be prevented.

Referring to FIG. 2, the display panel 100 is prepared, and then the digitizer assembly 200 is attached to a lower portion of the display panel 100.

Instead of individually forming the buffering sheet 210, the digitizer 220, the shield sheet 230, and the heat dissipation sheet 240, and attaching them sequentially, in the present exemplary embodiment, the digitizer board 200a is formed first and then the digitizer assembly 200 including the buffering sheet 210, the digitizer 220, the shield sheet 230, and the heat dissipation sheet 240 is formed at once through the blanking process with the press 500 so that the buffering sheet 210, the digitizer 220, the shield sheet 230, and the heat dissipation sheet 240 are integrally formed, thereby reducing a bezel area of the display device 1000.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A method for manufacturing a display device, comprising:
    forming a digitizer assembly; and
    attaching the digitizer assembly to a bottom of a display panel,
    wherein the forming the digitizer assembly comprises:
        forming through-hole portions in a heat dissipation sheet layer at corners of the digitizer assembly,
        forming a digitizer board by sequentially attaching a buffering sheet layer, a digitizer layer, a shield sheet layer, and the heat dissipation sheet layer, and
        forming a plurality of digitizer assemblies by cutting the digitizer board,
    wherein each of the through-hole portions exposes the shield sheet layer disposed corresponding to the corner of the digitizer assembly, and
    wherein each of the through-hole portions overlaps a corner of the display panel and does not overlap an edge of the display panel other than the corner of the display panel in a plan view.

2. The method for manufacturing the display device of claim 1, wherein the digitizer assembly comprises a buffering sheet, a digitizer, a shield sheet, and a heat dissipation sheet that are sequentially attached, each of the buffering sheet, the digitizer, the shield sheet, and the heat dissipation sheet being a portion of the buffering sheet layer, the digitizer layer, the shield sheet layer and the heat dissipation sheet layer, respectively, which corresponds to the digitizer assembly.

3. The method for manufacturing the display device of claim 2, wherein the heat dissipation sheet comprises openings that partially expose the shield sheet disposed corresponding to the corner of the digitizer assembly, each of the openings in the heat dissipation sheet corresponding to a partial portion of each through-hole portions in the heat dissipation sheet layer.

4. The method for manufacturing the display device of claim 3, wherein the openings are disposed at corners of the heat dissipation sheet.

5. A method for manufacturing a digitizer assembly that includes a buffering sheet, a digitizer, a shield sheet, and a heat dissipation sheet, comprising:
    forming through-hole portions in a heat dissipation sheet layer which includes a plurality of heat dissipation sheets forming areas at corners of the digitizer assembly;
    forming a digitizer board by sequentially attaching a buffering sheet layer which includes a plurality of buffering sheets forming areas, a digitizer layer which includes a plurality of digitizers forming areas, a shield sheet layer which includes a plurality of shield sheets forming areas, and the heat dissipation sheet layer; and
    cutting the digitizer board into a plurality of digitizer assemblies,
    wherein each of the through-hole portions exposes the shield sheet layer disposed corresponding to the corner of the digitizer assembly, and
    wherein each of the through-hole portions overlaps a corner of the digitizer assembly and does not overlap an edge of the digitizer assembly other than the corner of the digitizer assembly in a plan view.

6. The method for manufacturing the digitizer assembly of claim 5, wherein the cutting of the digitizer board comprises performing a blanking process using a press.

7. The method for manufacturing the digitizer assembly of claim 6, wherein the buffering sheet, the digitizer, the shield sheet, and the heat dissipation sheet are sequentially attached.

8. The method for manufacturing the digitizer assembly of claim 7, wherein the heat dissipation sheet comprises openings that partially expose the shield sheet disposed corresponding to the corner of the digitizer assembly, each of the openings in the heat dissipation sheet corresponding to a partial portion of each through-hole portions in the heat dissipation sheet layer.

9. The method for manufacturing the digitizer assembly of claim 8, wherein the openings are disposed at corners of the heat dissipation sheet.

* * * * *